United States Patent
Ananthiah et al.

(10) Patent No.: US 9,722,612 B2
(45) Date of Patent: Aug. 1, 2017

(54) CONFIGURATION SEQUENCE FOR PROGRAMMABLE LOGIC DEVICE

(71) Applicant: Lattice Semiconductor Corporation, Hillsboro, OR (US)

(72) Inventors: Umesh Ananthiah, San Jose, CA (US); Tramie Tran, San Jose, CA (US); Jamie Freed, Fleetwood, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 1100 days.

(21) Appl. No.: 13/904,861

(22) Filed: May 29, 2013

(65) Prior Publication Data
US 2014/0108628 A1    Apr. 17, 2014

Related U.S. Application Data

(60) Provisional application No. 61/714,636, filed on Oct. 16, 2012.

(51) Int. Cl.
*H03K 19/177* (2006.01)
*H04L 12/801* (2013.01)
(Continued)

(52) U.S. Cl.
CPC ............ *H03K 19/17712* (2013.01); *G01R 31/318597* (2013.01); *G11C 11/413* (2013.01); *G11C 16/24* (2013.01); *G11C 17/16* (2013.01); *H01L 23/49838* (2013.01); *H03K 19/177* (2013.01); *H03K 19/17704* (2013.01); *H03K 19/17716* (2013.01); *H03M 1/001* (2013.01); *H03M 1/34* (2013.01); *H04L 25/0262* (2013.01); *H04L 41/0806* (2013.01); *H04L 47/10* (2013.01); *H01L 23/49816* (2013.01); *H01L 23/49822* (2013.01); *H01L 23/50* (2013.01); *H01L 23/60* (2013.01); *H01L 2224/16225* (2013.01);
(Continued)

(58) Field of Classification Search
CPC .............. H04L 41/0806; H03K 19/177; H03K 19/17704; H03K 19/17712; H03K 19/17716
See application file for complete search history.

(56) References Cited

U.S. PATENT DOCUMENTS

| | | | |
|---|---|---|---|
| 6,011,407 A | 1/2000 | New | |
| 7,345,507 B1 * | 3/2008 | Young | H03K 19/177 326/16 |
| 7,420,392 B2 | 9/2008 | Schultz et al. | |
| 7,506,087 B2 | 3/2009 | Ho et al. | |
| 7,626,418 B1 * | 12/2009 | Kolze | H03K 19/17732 326/39 |
| 7,932,743 B1 * | 4/2011 | Stewart | H03K 19/17756 326/38 |
| 8,352,648 B1 * | 1/2013 | Puranik | G06F 13/4022 710/36 |

(Continued)

OTHER PUBLICATIONS

PCI-SIG, PCI Express Base Specification Revision 2.1, Mar. 4, 2009, pp. 1-23 and 404-407.

(Continued)

*Primary Examiner* — Dennis M Butler
(74) *Attorney, Agent, or Firm* — Haynes and Boone, LLP

(57) ABSTRACT

Techniques are provided to permit a programmable logic device (PLD) to comply with a communication standard before the PLD is fully configured. In one example, a method includes programming a first portion of a programmable logic device (PLD) with first configuration data. After the first portion is programmed, the first portion is operated in accordance with a communication standard to exchange data with a host system while a second portion of the PLD is programmed with second configuration data.

16 Claims, 4 Drawing Sheets

(51) Int. Cl.
   *G11C 11/413*   (2006.01)
   *H04L 25/02*    (2006.01)
   *H04L 12/24*    (2006.01)
   *G01R 31/3185*  (2006.01)
   *H03M 1/00*     (2006.01)
   *H03M 1/34*     (2006.01)
   *G11C 16/24*    (2006.01)
   *G11C 17/16*    (2006.01)
   *H01L 23/498*   (2006.01)
   *H01L 23/50*    (2006.01)
   *H01L 23/60*    (2006.01)

(52) U.S. Cl.
   CPC ............... *H01L 2224/32225* (2013.01); *H01L 2224/73204* (2013.01); *H01L 2924/13091* (2013.01); *H01L 2924/15311* (2013.01)

(56) References Cited

U.S. PATENT DOCUMENTS

2003/0179771 A1\* 9/2003 Chan .................. H04L 12/26
                                                    370/445

OTHER PUBLICATIONS

Lattice Semiconductor Corporation, Delivering FPGA-Based Pre-Engineered IP Using Structured ASIC Technology, Feb. 2006, pp. 1-19.

\* cited by examiner

CONFIGURATION SEQUENCE FOR PROGRAMMABLE LOGIC DEVICE

CROSS-REFERENCE TO RELATED APPLICATIONS

This application claims the benefit of U.S. Provisional Patent Application No. 61/714,636 filed Oct. 16, 2012 which is hereby incorporated by reference in its entirety.

TECHNICAL FIELD

The present disclosure relates generally to programmable logic devices and, more particularly, to configuration operations for such devices.

BACKGROUND

Various host systems may be implemented with one or more programmable logic devices (PLDs) (e.g., field programmable gate arrays (FPGAs), complex programmable logic devices (CPLDs), field programmable systems on a chip (FPSCs), or other types of programmable devices). PLDs are typically programmed with configuration data each time they are booted (e.g., when a host system is turned on or otherwise reset). This programming takes time as configuration data is loaded into the PLD and written into various memories therein to configure the PLD for operation.

In some cases, the programming time may exceed the maximum allowable boot time permitted under a particular operational standard (e.g., a protocol and/or other operational requirements). In particular, the Peripheral Computer Interface Express (PCIe) standard may require PCIe compatible devices to respond to configuration requests within 100 ms of being reset, which many conventional PLDs cannot meet.

Conventional techniques to reduce PLD programming time include, for example, using parallel flash memories to provide configuration data to the PLD more rapidly. However, such implementations are often cost prohibitive. Accordingly, there is a need for a PLD and related programming techniques that can satisfy the boot time constraints of one or more operational standards.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with several embodiments set forth herein, various techniques are provided to permit at least a portion of a programmable logic device (PLD) to be programmed with configuration data while being synchronized to a first clock signal. After the programmed portion locks on to a second clock signal, the programmed portion switches its synchronization from the first clock signal to the second clock signal. The programmed portion of the PLD becomes operational and available to exchange data with a host system in accordance with a communication standard before a remainder of the PLD is programmed with the configuration data. The remainder of the PLD is programmed with configuration data while the programmed portion of the PLD is synchronized to the second clock signal.

As a result, the programmed portion of the PLD is operational to communicate with other devices quickly after the PLD is powered on or reset. Advantageously, such an operational state may be achieved even if the remainder of the PLD has not yet been configured.

Such implementations permit the PLD to be used in applications requiring rapid boot times (e.g., as a PCIe controller or other device). In this regard, the PLD may offer boot times comparable to that typically associated with hardwired circuitry, but with far more configurability and customization options (e.g., in contrast to conventional hardwired circuitry that cannot be easily repurposed to support different features in diverse applications).

The various techniques disclosed herein are applicable to a wide variety of integrated circuits and applications. In various example implementations, a PLD will be utilized to illustrate the techniques in accordance with one or more embodiments of the disclosure. However, it should be understood that this is not limiting and that the techniques disclosed herein may be implemented as desired, in accordance with one or more embodiments of the disclosure, within various types of circuits.

Figure 1:
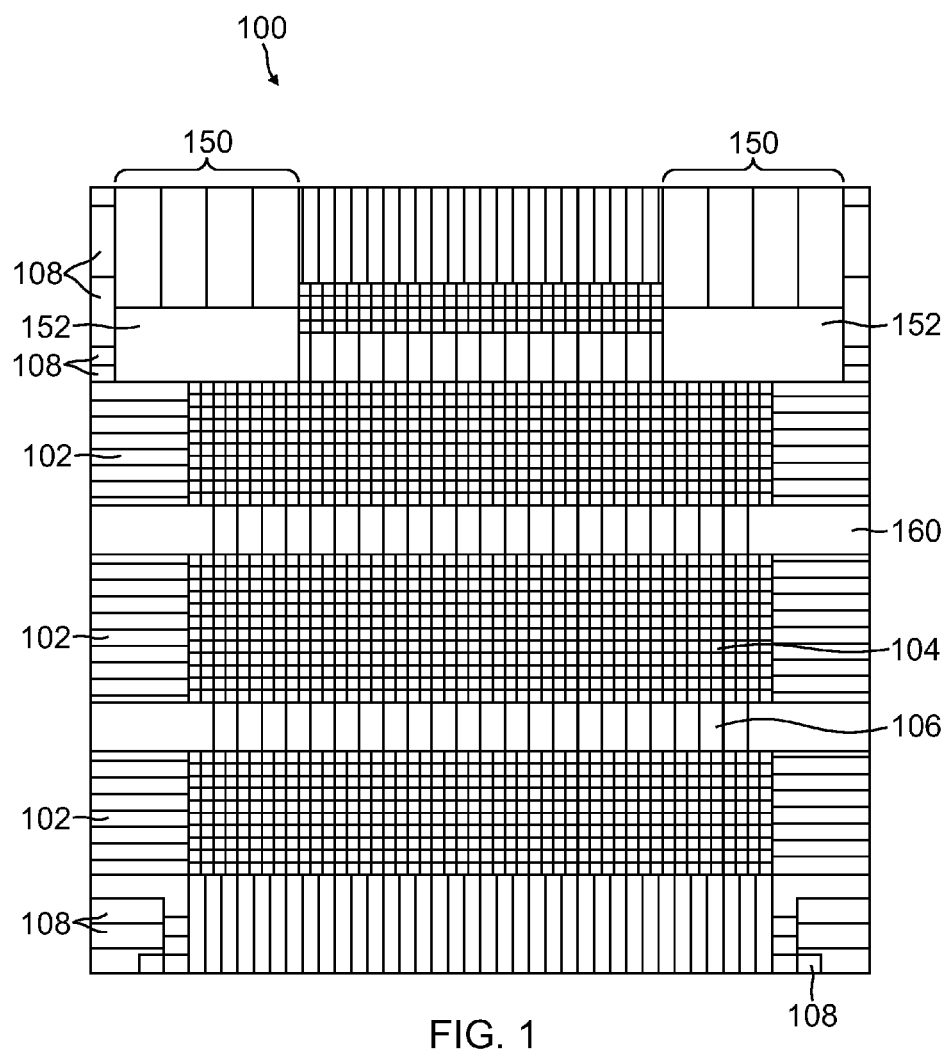
FIG. 1 illustrates a block diagram of a programmable logic device (PLD) in accordance with an embodiment of the disclosure.

Referring now to the figures, FIG. 1 illustrates a block diagram of a PLD 100 in accordance with an embodiment of the disclosure. In one embodiment, PLD 100 may be implemented as a PLD in the SC/M family of devices available from Lattice Semiconductor Corporation of Hillsboro, Oreg.

PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 also includes hard intellectual property core (IP) blocks 160 to provide additional functionality (e.g., substantially predetermined functionality provided in hardware which may be configured with less programming than logic blocks 104).

Figure 2:
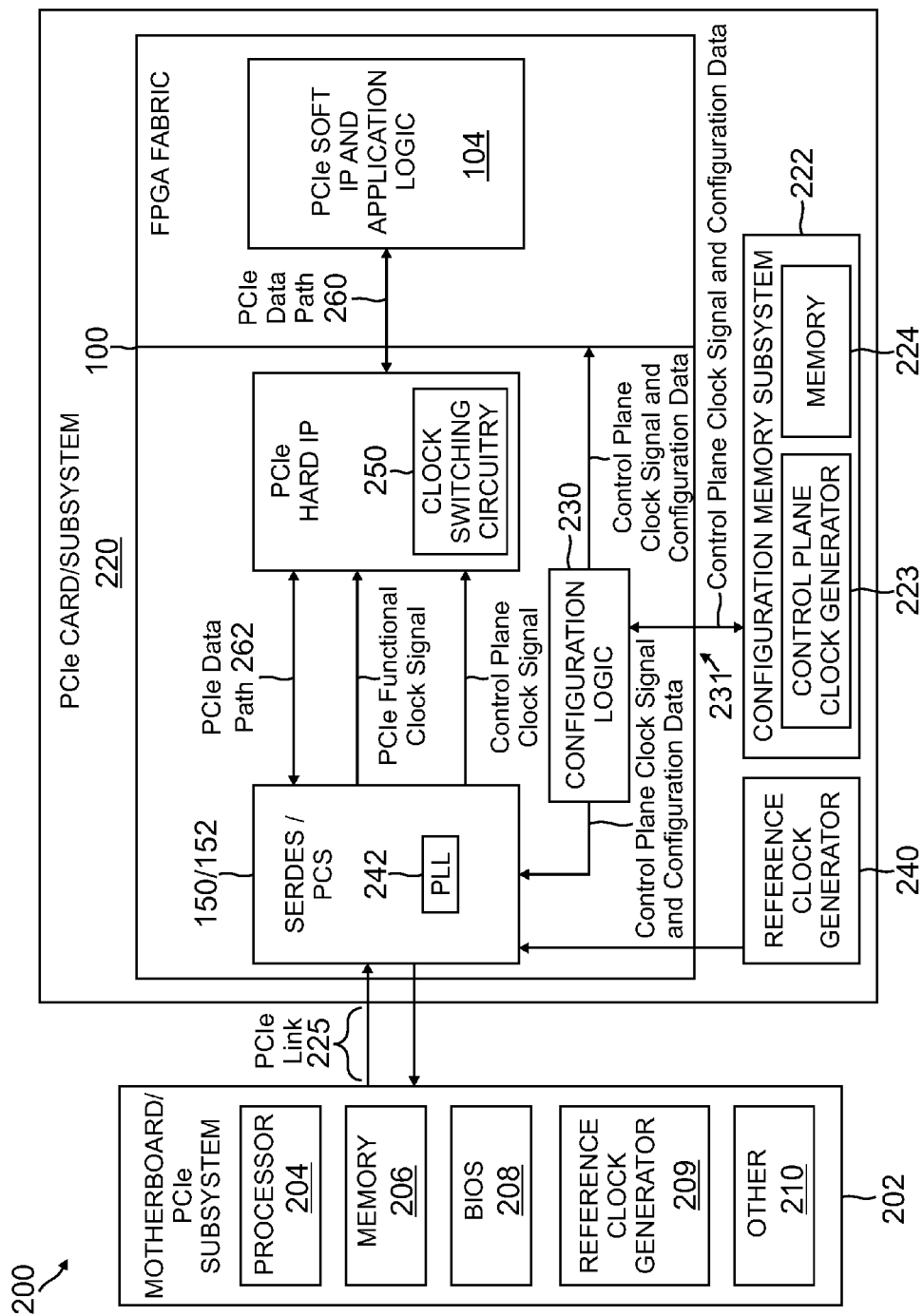
FIG. 2 illustrates a PLD implemented as part of a host system in accordance with an embodiment of the disclosure.

PLD 100 may also include blocks of memory 106 (e.g., blocks of EEPROM, block SRAM, and/or flash memory), clock-related circuitry 108 (e.g., PLL and/or DLL circuits), configuration logic 230 (e.g., see FIG. 2, used for startup, decryption, encryption, multiple-boot support (e.g., dual boot support), and/or error detection), a configuration port 231 (e.g., see FIG. 2 and/or provided by I/O blocks 102), a configuration memory subsystem 222 (e.g., see FIG. 2 which may be implemented with a control plane clock generator 223, memory 224, and/or appropriate logic, any of which may be provided within PLD 100 and/or external to PLD 100), and/or various routing resources as appropriate. In general, the various elements of PLD 100 may be used to perform their intended functions for desired applications, as would be understood by one skilled in the art.

For example, I/O blocks 102 and/or configuration port 231 may be used for programming PLD 100, such as memory 106 and/or configuration memory subsystem 222 or transferring information (e.g., various types of data and/or control signals) to/from PLD 100 as would be understood by one skilled in the art. I/O blocks 102 and/or configuration port 231 may provide a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). I/O blocks 102 and/or configuration port 231 typically, for example, may be included to receive configuration data and commands to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout PLD 100, such as in and between logic blocks 104 and hard IP blocks 160, to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

FIG. 2 illustrates PLD 100 implemented as part of a host system 200 in accordance with an embodiment of the disclosure. For example, in some embodiments, host system 200 may be a computer system. In this regard, PLD 100 may be implemented on a subsystem 220 of a computer system including a motherboard 202 (e.g., supporting a PCIe subsystem or other appropriate subsystems) with one or more processors 204, memories 206, BIOS 208, a reference clock generator 209, and/or other components 210. For example, subsystem 220 may be implemented as a peripheral card (e.g., a PCIe card) installed in a computer system as shown in FIG. 2. As another example, subsystem 220 may be implemented as part of motherboard 202 (e.g., as a PCIe subsystem) or elsewhere as desired for particular applications.

In the embodiment shown in FIG. 2, PLD 100 is used as a controller to support communications between subsystem 220 and motherboard 202 over one or more communication buses 225 in accordance with one or more communication standards (e.g., providing a PCIe link in accordance with a PCIe standard or other link in accordance with another standard). PLD 100 may be implemented in other types of host systems such as, for example, embedded systems, portable electronic devices, networked devices, and/or other systems or devices as may be desired for various applications.

PLD 100 includes SERDES/PCS blocks 150/152 used to support serialization, deserialization, and low level communications with one or more communication buses 225. PLD 100 also includes a hard IP block 160 which may be implemented with appropriate circuitry that, after it is configured (e.g., programmed), is available to exchange data with host system 200 (e.g., through SERDES/PCS blocks 150/152 over a data path 262 such as a PCIe data path). For example, when implemented as a PCIe hard IP block, hard IP block 160 may respond to configuration requests received over one or more communication buses 225. Thus, when hard IP block 160 is operational, PLD 100 may be detected as a PCIe controller by host system 200 in accordance with a PCIe standard (e.g., within 100 ms of a reset of host system 200), even if another portion of PLD 100 (e.g., logic blocks 104) is not yet configured.

As shown, logic blocks 104 may be configured to provide one or more PCIe soft IP cores and application logic. For example, logic blocks 104 may be used to support PCIe controller operations of hard IP block 160 subsequent to the detection of hard IP block 160 by host system 200.

As shown, configuration memory subsystem 222 may be provided, for example, on peripheral card 220. In other embodiments, configuration memory subsystem 222 may be provided as part of PLD 100. Configuration memory subsystem 222 may be implemented with memory 224 (e.g., one or more flash memories or other types of memory in various embodiments) used to store configuration data to program PLD 100 for operation. Configuration memory subsystem 222 may include control plane clock generator 223 (e.g., also referred to as a programming clock generator) used to provide a control plane clock signal used to synchronize the programming of various portions of PLD 100.

In some embodiments, the control plane clock signal may be provided separately from the configuration data. In other embodiments, the configuration data may be provided as a data stream (e.g., a bitstream) with the control plane clock signal embedded therein.

PLD 100 also includes configuration logic 230 which receives the configuration data and control plane clock signal from configuration memory subsystem 222, and provides the same to SERDES/PCS blocks 150/152 and logic blocks 104. A reference clock generator 240 may be provided, for example, as part of subsystem 220 separate from PLD 100 (as shown in FIG. 2) or as part of PLD 100.

When PLD 100 is implemented as a PCIe controller, communication buses 225 may be implemented as one or more PCIe lanes (e.g., PCIe x1, x4, x8, x16, and/or other PCIe lane implementations), and one or more components of motherboard 202 (e.g., processor 204 and/or I/O circuitry 208) may be implemented as a root complex which communicates with PLD 100 in accordance with a PCIe standard. In such embodiments, PLD 100 may be required to be available to respond to configuration requests within 100 ms of a reset of host system 200 (e.g., when the root complex is reset). As further described herein, various components of PLD 100 may be programmed and synchronized to support such requirements before PLD 100 is entirely programmed.

SERDES/PCS blocks 150/152 are programmed by the configuration data in a programming operation that is synchronized by the control plane clock signal. After being programmed, SERDES/PCS blocks 150/152 pass configuration data and the control plane clock signal (received from configuration logic 230) to hard IP block 160 in order to program (e.g., configure) hard IP block 160. In addition, SERDES/PCS blocks 150/152 and hard IP block 160 are synchronized by the control plane clock signal while a phase-locked loop (PLL) 242 attempts to lock on to a reference clock signal (e.g., received from reference clock generator 209 over one or more of communication buses 225 or from reference clock generator 240). After PLL 242 locks on to the reference clock signal, it provides an operating clock signal (e.g., also referred to as a PCIe functional clock signal in PCIe implementations) to hard IP block 160. As shown, hard IP block 160 includes clock switching circuitry 250 to switch from synchronizing by the control plane clock signal to synchronizing by the operating clock signal.

When operational, hard IP block 160 selectively disables a data path 260 (e.g., also referred to as a PCIe data path in PCIe implementations) between hard IP block 160 and logic blocks 104 while logic blocks 104 are programmed, and selectively enables data path 260 when logic blocks 104 are operational.

Figure 3:
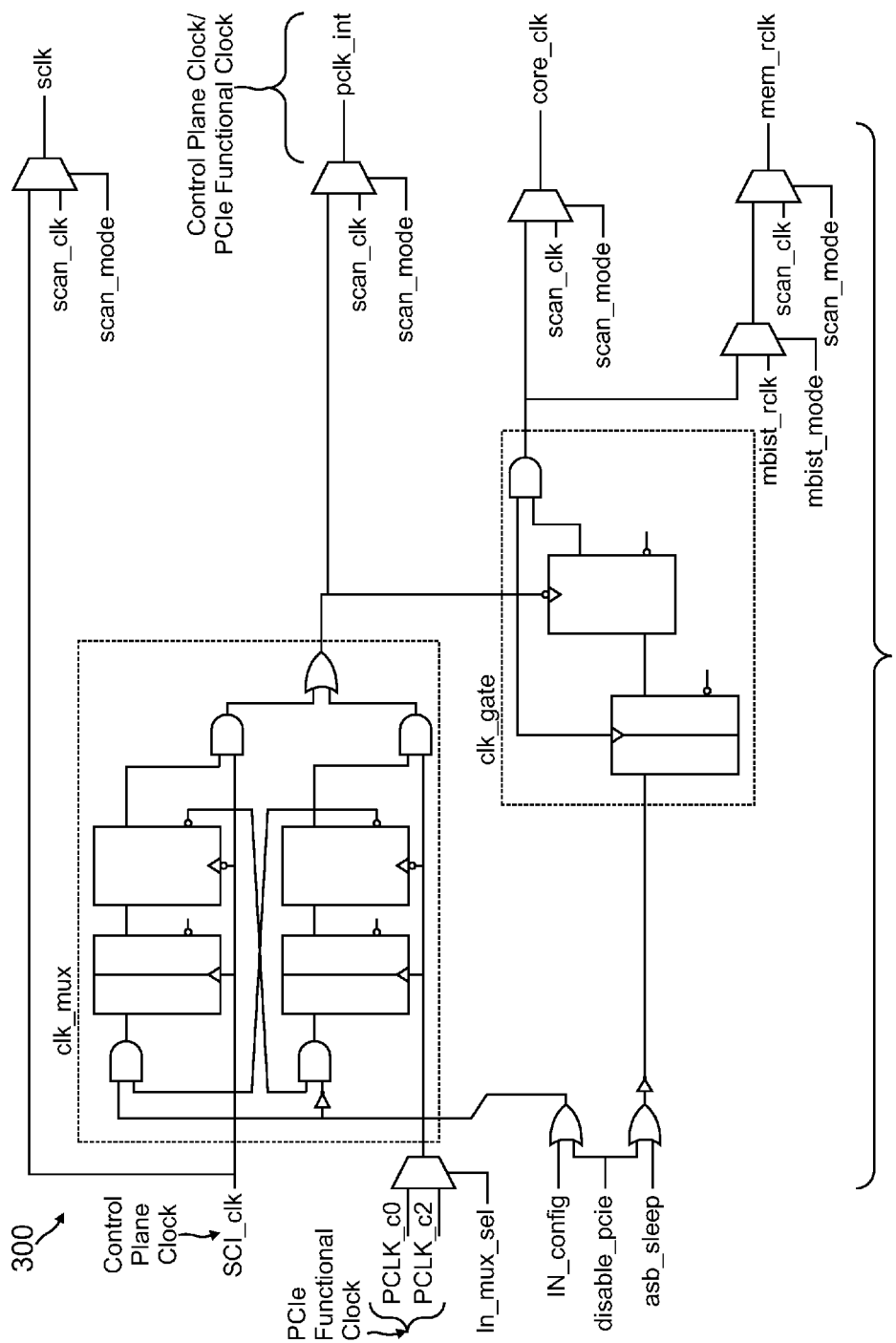
FIG. 3 illustrates a clock network in accordance with an embodiment of the disclosure.

FIG. 3 illustrates a clock network 300 of a portion of PLD 100 in accordance with an embodiment of the disclosure. For example, clock network 300 may be implemented in hard IP block 160. As shown, clock network 300 receives the control plane clock signal and one or more operating clock signals (e.g., two functional PCIe clock signals PCLK_c0 and PCLK_c2 are provided in the illustrated embodiment). Clock switching circuitry 250 (e.g., logic) operates to selectively pass the control plane clock signal or an operating clock signal (e.g., when provided by PLL 242) as one or more clock signals pclk_int, core_clk, and mem_rclk to synchronize hard IP block 160.

Figure 4:
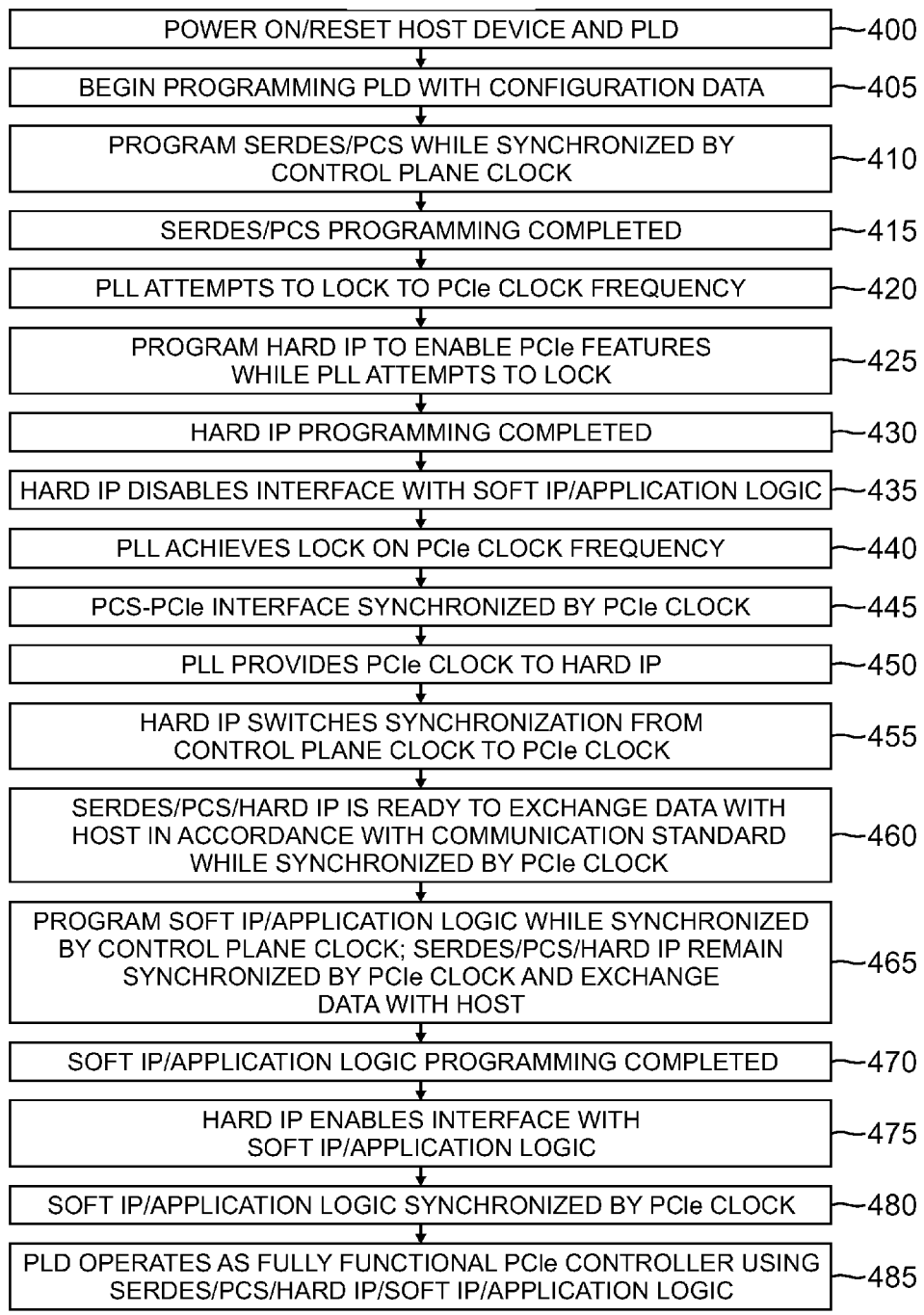
FIG. 4 illustrates a process of programming a PLD in accordance with an embodiment of the disclosure.

FIG. 4 illustrates a process of programming PLD 100 in accordance with an embodiment of the disclosure. Host system 200 is initially powered on or otherwise reset (operation 400). This causes peripheral card 220 and PLD 100 to also power on/reset.

In response to the power on/reset, configuration logic 230 begins programming PLD 100 with configuration data (e.g., at least a first subset of the configuration data) received from configuration memory subsystem 222 (operation 405). For example, as shown in FIG. 2, configuration logic 230 programs SERDES/PCS blocks 150/152 using the control plane clock signal and configuration data (operation 410).

After SERDES/PCS blocks 150/152 are programmed with their corresponding configuration data (operation 415), they begin operating in accordance with their newly programmed configuration and continue to be synchronized by the control plane clock signal received from configuration logic 230. In this regard, PLL 242 attempts to lock on to a reference clock signal provided by reference clock generator 209 or 240 (operation 420). In various embodiments, the reference clock signal may be provided as a separate clock signal or embedded in a data stream (e.g., in a data stream received over one or more communication buses 225).

While PLL 242 is in the process of locking, SERDES/PCS blocks 150/152 (e.g., collectively referred to as a PCS-PCIe interface) pass the control plane clock signal and configuration data (e.g., at least a second subset of the configuration data) received from configuration logic 230 to hard IP block 160 which is programmed with the configuration data to enable PCIe features of hard IP block 160 (e.g., to permit such features to be accessed for use in a PCIe controller) (operation 425). For example, such configuration data may identify the manner in which hard IP block 160 is to operate (e.g., as an endpoint device, bridge, root complex, and/or other manner).

After hard IP block 160 is programmed with the configuration data (operation 430), it disables an interface with logic blocks 104 (e.g., data path 260) in preparation for the programming of logic blocks 104 with configuration data (operation 435). Such disabling may be performed, for example, by operation of appropriate circuitry of hard IP block 160 and/or the passing of appropriate data (e.g., data values, commands, flags, and/or other information) between hard IP block 160, logic blocks 104, SERDES/PCS blocks 150/152, and/or configuration logic 230. The disabling of data path 260 may prevent inadvertent and/or unpredictable data transfers between hard IP block 160 and logic blocks 104 while logic blocks 104 are being configured.

In operation 440, PLL 242 locks on to the reference clock signal and begins providing an operating clock signal (e.g., a PCIe functional clock signal) in response thereto. As a result, SERDES/PCS blocks 150/152 are synchronized by the PCIe functional clock signal (operation 445) and PLL 242 provides the PCIe functional clock signal to hard IP block 160 (operation 450).

In operation 455, clock switching circuitry 250 switches from providing the control plane clock signal to providing the PCIe functional clock signal to other portions of hard IP block 160. This causes hard IP block 160 to switch from synchronizing by the control plane clock signal to synchronizing by the PCIe functional clock signal. As a result, SERDES/PCS blocks 150/152 and hard IP block 160 are all synchronized by the PCIe functional clock signal and operate independently of the control plane clock signal.

In operation 460, SERDES/PCS blocks 150/152 and hard IP block 160 are ready to exchange data with host system 200 before logic blocks 104 have been fully programmed with corresponding configuration data. In this regard, hard IP block 160 may be implemented with appropriate circuitry that is sufficient to exchange data with host system 200 after it is configured (e.g., finished programming in operation 430) and synchronized to the PCIe functional clock signal (e.g., in operation 455).

As discussed, in some implementations, PLD 100 may be implemented as a PCIe controller. In such cases, hard IP block 160 may be implemented as a PCIe IP core used to respond to configuration requests received from one or more components of motherboard 202. Because SERDES/PCS blocks 150/152 and hard IP block 160 are rapidly configured before logic blocks 104 are fully programmed, PLD 100 will be available to respond to configuration requests shortly after a reset/power on of host system 200 (e.g., operation 460 may occur within 100 ms of operation 400). As a result, PLD 100 may appear to host system 200 as an available PCIe controller or other appropriate PCIe device in compliance with a PCIe standard, thus permitting host system 200 to operate without interruption even while logic blocks 104 are programmed.

In operation 465, configuration logic 230 begins programming logic blocks 104 with configuration data. Such programming is synchronized by the control plane clock signal. In some embodiments, the programming of logic blocks 104 may take substantially longer than the relatively fast (e.g., within 100 ms) programming of SERDES/PCS blocks 150/152 and hard IP block 160. Meanwhile, also during operation 465, SERDES/PCS blocks 150/152 and hard IP block 160 remain synchronized by the PCIe functional clock signal and operate to exchange data with host system 200 as discussed.

After logic blocks 104 are programmed (operation 470), hard IP block 160 enables the interface with logic blocks 104 (e.g., data path 260) (operation 475), and logic blocks 104 are synchronized by the PCIe functional clock (operation 480) (e.g., received over data path 260). Thereafter, SERDES/PCS blocks 150/152, hard IP block 160, and logic blocks 104 may operate to provide PCIe controller services to host system 200 and peripheral card 220 while synchronized by PCIe functional clock (operation 485).

Additional embodiments are also contemplated. For example, although IP block 160 has been described as a configurable hard IP block, other configurations may be used where appropriate. For example, in some embodiments, one or more IP blocks 160 may be implemented as non-configurable hard IP blocks and/or configurable soft IP blocks. In the case of non-configurable hard IP blocks, logic functionality may be hardwired with an entirely predetermined configuration. In such case, operations 425 and 430 of FIG. 4 may be skipped. In the case of soft IP blocks, more extensive programming may be performed in operation 425 of FIG. 4.

Embodiments described above illustrate but do not limit the invention. It should also be understood that numerous modifications and variations are possible in accordance with the principles of the present invention. Accordingly, the scope of the invention is defined only by the following claims which are incorporated into this section by reference.

We claim:

1. A method comprising:
   programming a first portion of a programmable logic device (PLD) with first configuration data, wherein the first portion comprises a physical coding sublayer (PCS) block and an intellectual property core (IP) block, wherein the programming the first portion comprises:
   configuring the PCS block with at least a first subset of the first configuration data; and
   passing at least a second subset of the first configuration data from the PCS block to the IP block; and
   after the first portion is programmed, operating the IP block in accordance with a communication standard to exchange data with a host system while programming a second portion of the PLD with second configuration data.

2. The method of claim 1, further comprising:
   synchronizing the programming of the first portion by a first clock signal; and
   synchronizing the operating of the IP block by a second clock signal while synchronizing the programming of the second portion by the first clock signal.

3. The method of claim 2, wherein the PLD is implemented in a subsystem of the host system, the method further comprising:
   generating the first clock signal at the subsystem; and
   receiving the second clock signal at the subsystem from the host system.

4. The method of claim 1, wherein:
   the host system is a computer system;
   the PLD is implemented in a peripheral component interconnect express (PCIe) subsystem of the computer system;
   the communication standard is a PCIe standard; and
   the first portion is programmed in less than 100 ms to comply with the PCIe standard.

5. The method of claim 4, wherein the PCIe subsystem is a peripheral card installed in a motherboard of the computer system.

6. The method of claim 1, further comprising disabling a data path between the first and second portions while the second portion is programmed.

7. The method of claim 1, wherein the IP block is a configurable hard IP block.

8. The method of claim 1, wherein the IP block is a non-configurable hard IP block, wherein the non-configurable hard IP block is not programmed with the first configuration data.

9. A device comprising:
   a first portion of a programmable logic device (PLD) adapted to be programmed with first configuration data, wherein the first portion comprises:
   an intellectual property core (IP) block; and
   a physical coding sublayer (PCS) block adapted to be programmed by at least a first subset of the first configuration data and pass at least a second subset of the first configuration data from the PCS block to the IP block;
   a second portion of the PLD adapted to be programmed with second configuration data; and
   wherein the IP block is adapted to operate in accordance with a communication standard to exchange data with a host system after the first portion is programmed and while the second portion is programmed.

10. The device of claim 9, wherein:
    the first portion is adapted to synchronize to a first clock signal while the first portion is programmed and to a second clock signal while the second portion is programmed; and
    the second portion is adapted to synchronize to the first clock signal while the second portion is programmed.

11. The device of claim 10, further comprising a subsystem of the host system, the subsystem comprising:
    the PLD;
    a clock generator adapted to generate the first clock signal; and
    wherein the second clock signal is received at the subsystem from the host system.

12. The device of claim 9, wherein:
    the host system is a computer system;
    the PLD is part of a peripheral component interconnect express (PCIe) subsystem adapted to be implemented in the computer system;
    the communication standard is a PCIe standard; and
    the first portion is adapted to be programmed in less than 100 ms to comply with the PCIe standard.

13. The device of claim 12, wherein the PCIe subsystem is a peripheral card adapted to be installed in a motherboard of the computer system.

14. The device of claim 9, wherein the first portion is adapted to disable a data path between the first and second portions while the second portion is programmed.

15. The device of claim 9, wherein the IP block is a configurable hard IP block.

16. The device of claim 9, wherein:
    the IP block is a non-configurable hard IP block; and
    the non-configurable hard IP block is not programmed with the first configuration data.

* * * * *